US010348287B2

(12) United States Patent
Jia

(10) Patent No.: US 10,348,287 B2
(45) Date of Patent: Jul. 9, 2019

(54) SWITCHED-CAPACITOR CIRCUIT, A RADIO FREQUENCY DEVICE, AND A SWITCHED-CAPACITOR CIRCUIT MANUFACTURING METHOD

(71) Applicants: Semiconductor Manufacturing International (Shanghai) Corporation, Shanghai (CN); Semiconductor Manufacturing International (Beijing) Corporation, Beijing (CN)

(72) Inventor: Hai Long Jia, Shanghai (CN)

(73) Assignees: SEMICONDUCTOR MANUFACTURING INTERNATIONAL (SHANGHAI) CORPORATION (CN); SEMICONDUCTOR MANUFACTURING INTERNATIONAL (BEIJING) CORPORATION (CN)

( * ) Notice: Subject to any disclaimer, the term of this patent is extended or adjusted under 35 U.S.C. 154(b) by 0 days.

(21) Appl. No.: 15/923,676

(22) Filed: Mar. 16, 2018

(65) Prior Publication Data

US 2018/0269862 A1 Sep. 20, 2018

(30) Foreign Application Priority Data

Mar. 17, 2017 (CN) .......................... 2017 1 0158468

(51) Int. Cl.
*H03K 17/06* (2006.01)
*H03F 3/00* (2006.01)
*H03F 3/45* (2006.01)
*H01L 27/06* (2006.01)

(52) U.S. Cl.
CPC ............. *H03K 17/06* (2013.01); *H03F 3/005* (2013.01); *H03F 3/45179* (2013.01); *H01L 27/0629* (2013.01); *H03F 2203/45394* (2013.01)

(58) Field of Classification Search
CPC ........ H03K 17/06; H03K 17/04; H03K 17/30; H03K 17/60; H03K 19/20; H03K 5/05; H03K 5/06; H03K 3/012
USPC ........................................ 327/554, 560, 566
See application file for complete search history.

(56) References Cited

U.S. PATENT DOCUMENTS

2015/0318852 A1* 11/2015 Hoogzaad ............ H03K 17/687
327/434

FOREIGN PATENT DOCUMENTS

CN 103001618 A 3/2013

* cited by examiner

*Primary Examiner* — John W Poos
(74) *Attorney, Agent, or Firm* — Innovation Counsel LLP

(57) ABSTRACT

A switched-capacitor circuit, a radio frequency device and a switched-capacitor circuit manufacturing method, relating to discrete capacitance design. The switched-capacitor circuit comprises a first capacitor branch and a second capacitor branch, wherein each of the first capacitor branch and the second capacitor branch has at least one high-resistance resistor; and a transistor connecting the first capacitor branch and the second capacitor branch. This inventive concept effectively reduces the parasitic capacitance when the transistor is in an "OFF" state without affecting the quality factor when the transistor is in an "ON" state.

13 Claims, 3 Drawing Sheets

SWITCHED-CAPACITOR CIRCUIT, A RADIO FREQUENCY DEVICE, AND A SWITCHED-CAPACITOR CIRCUIT MANUFACTURING METHOD

CROSS-REFERENCE TO RELATED APPLICATION

This application claims priority to and benefit of Chinese Patent Application No. 201710158468.7 filed on Mar. 17, 2017, which is incorporated herein by reference in its entirety.

BACKGROUND (a) Field of the Invention

This inventive concept relates generally to discrete capacitance design, and more specifically, to a switched-capacitor circuit, a radio frequency device, and a switched-capacitor circuit manufacturing method.

(b) Description of the Related Art

Differential signal is one of the most frequently used signals in a radio frequency circuit. Two differential ports of a differential signal are commonly connected to switched capacitors and on-chip inductors for frequency tuning to achieve high resistance in a narrow frequency band, and thus realize functions such as signal amplification and signal filtering. As a result, differential switched capacitors are commonly used in radio frequency circuit modules such as operational amplifier, voltage controlled oscillator, low noise amplifier, and frequency mixer.

A switched-capacitor circuit has two work modes: an "ON" mode and an "OFF" mode. A well-designed radio frequency switched-capacitor circuit will have as small as possible on-resistance in "ON" mode to achieve a high quality factor (the "Q value"), while maintaining as small as possible parasitic capacitance in "OFF" mode to minimize the parasitic effect of the switched capacitor modular.

FIG. 1 shows a diagram illustrating a conventional switched-capacitor circuit. In "ON" mode, this circuit has an equivalent on-resistance of $R_{on} \times 2$, twice the on-resistance $R_{on}$ of a single Metal Oxide Semiconductor (MOS) transistor, therefore it has a low Quality factor.

FIG. 2 shows a diagram illustrating another conventional switched-capacitor circuit. In this circuit, a switch control signal D is connected to a gate of a first N-type Metal Oxide Semiconductor (NMOS) transistor N1, a gate of a second NMOS transistor N2, an input node of a first inverter 001, and an input node of a second inverter 002. A first node of a first capacitor C1 is connected to a drain of the first NMOS transistor N1, and a second node of the first capacitor C1 works as a first output node P. An output node of the first inverter 001 is connected to a first node of a first resistor R1, and a second node of the first resistor R1 is connected to the drain of the first NMOS transistor N1, a first node of the second capacitor C2 is connected to a drain of the second NMOS transistor N2, and a second node of the second capacitor C2 works as a second output node N. An output node of the second inverter 002 is connected to a first node of the second resistor R2, and a second node of the second resistor R2 is connected to the drain of the second NMOS transistor N2, a drain of a third NMOS transistor N3 is connected to the drain of the first NMOS transistor N1, a source of the third NMOS transistor N3 is connected to the drain of the second NMOS transistor N2, and a gate of the third NMOS transistor N3 is connected to a digital control signal D.

Compared to the circuit of FIG. 1, the circuit of FIG. 2 has a smaller parasitic capacitance in "OFF" mode. However, the circuit of FIG. 2 involves more circuit components and therefore is more complicated than that of FIG. 1. Also, in "OFF" mode, drain parasitic capacitances of the first NMOS transistors N1 and the second NMOS transistor N2 are introduced to the first capacitors C1 and the second capacitor C2, respectively, which increases the parasitic capacitance of the circuit.

SUMMARY

The inventors of this inventive concept investigated the issues in conventional techniques and proposed an innovative solution that effectively increases the Quality factor of a circuit in "ON" mode and reduces its parasitic capacitance in "OFF" mode.

This inventive concept first presents a switched-capacitor circuit, comprising:

a first capacitor branch and a second capacitor branch, wherein each of the first capacitor branch and the second capacitor branch has at least one high-resistance resistor; and a transistor connecting the first capacitor branch and the second capacitor branch.

Additionally, in the aforementioned circuit, the transistor may be a Metal Oxide Semiconductor (MOS) transistor.

Additionally, in the aforementioned circuit, the MOS transistor may be an N-type Metal Oxide Semiconductor (NMOS) transistor.

Additionally, in the aforementioned circuit, a first node of the transistor may be connected to a first node of a first capacitor in the first capacitor branch and a first node of a first high-resistance resistor in the first capacitor branch, a second node of the first high-resistance resistor in the first capacitor branch may be grounded, and a second node of the transistor may be connected to a first node of a second capacitor in the second capacitor branch and a first node of a second high-resistance resistor in the second capacitor branch, a second node of the second high-resistance resistor in the second capacitor branch may be grounded.

Additionally, in the aforementioned circuit, a gate of the transistor may be connected to a control voltage, a second node of the first capacitor in the first capacitor branch may be connected to a positive node of a differential signal, and a second node of the second capacitor in the second capacitor branch may be connected to a negative node of the differential signal.

Additionally, in the aforementioned circuit, the resistances of the high-resistance resistors may be higher than either an on-resistance of the transistor when the transistor is in an "ON" state, or a parasitic resistance between a source and a drain of the transistor when the transistor is in an "OFF" state.

Additionally, in the aforementioned circuit, the resistances of the high-resistance resistors may be higher than 1 k ohm and lower than 1000 k ohm.

Additionally, in the aforementioned circuit, the resistances of the high-resistance resistors may be 50 k ohm.

Additionally, in the aforementioned circuit, when a control voltage of the transistor is a high voltage, the first capacitor branch and the second capacitor branch may be serially connected to form an AC path, when the control voltage of the transistor is a low voltage, an equivalent capacitance of the first capacitor branch may equal to a parasitic capacitance on a source of the transistor, and an equivalent capacitance of the second capacitor branch may equal to a parasitic capacitance on a drain of the transistor.

This inventive concept further presents a radio frequency device, comprising the switched-capacitor circuit as described above.

This inventive concept further presents a switched-capacitor circuit manufacturing method, comprising:

providing a first capacitor branch and a second capacitor branch;

providing a transistor connecting the first capacitor branch and the second capacitor branch; and providing at least one high-resistance resistor at each of the first capacitor branch and the second capacitor branch.

Additionally, in the aforementioned method, a first node of the transistor may be connected to a first node of a first capacitor in the first capacitor branch and a first node of a first high-resistance resistor in the first capacitor branch, a second node of the first high-resistance resistor in the first capacitor branch may be grounded, and a second node of the transistor may be connected to a first node of a second capacitor in the second capacitor branch and a first node of a second high-resistance resistor in the second capacitor branch, a second node of the second high-resistance resistor in the second capacitor branch may be grounded.

Additionally, in the aforementioned method, a gate of the transistor may be connected to a control voltage, a second node of the first capacitor in the first capacitor branch may be connected to a positive node of a differential signal, and a second node of the second capacitor in the second capacitor branch may be connected to a negative node of the differential signal.

Additionally, in the aforementioned method, the resistances of the high-resistance resistors may be higher than either an on-resistance of the transistor when the transistor is in an "ON" state, or a parasitic resistance between a source and a drain of the transistor when the transistor is in an "OFF" state.

Additionally, in the aforementioned method, when a control voltage of the transistor is a high voltage, the first capacitor branch and the second capacitor branch may be serially connected to form an AC path, when the control voltage of the transistor is a low voltage, an equivalent capacitance of the first capacitor branch may equal to a parasitic capacitance on a source of the transistor, and an equivalent capacitance of the second capacitor branch may equal to a parasitic capacitance on a drain of the transistor.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

DETAILED DESCRIPTION OF THE EMBODIMENTS

Figure 1:
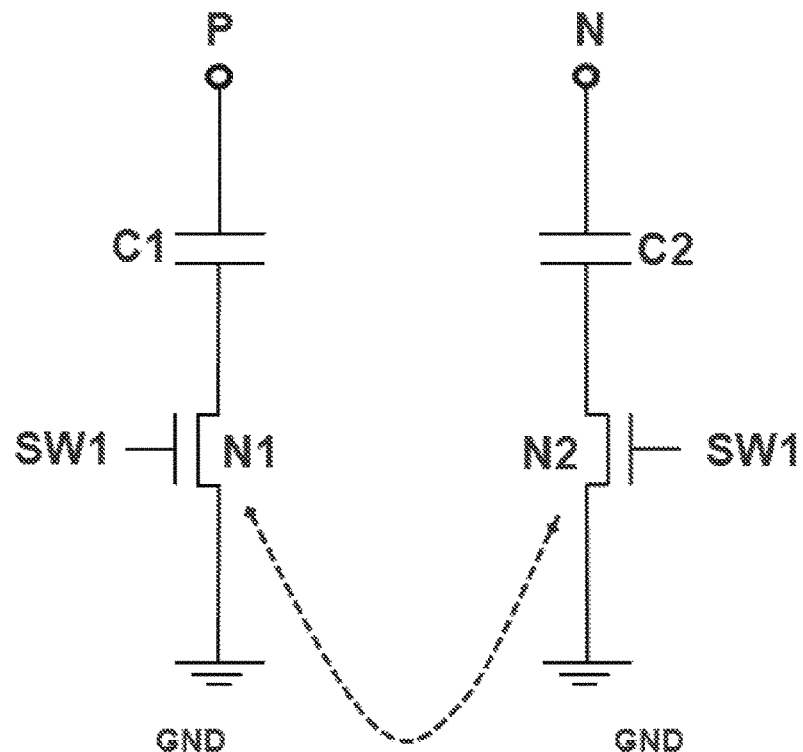
FIG. 1 shows a diagram illustrating a conventional switched-capacitor circuit.

Example embodiments of the inventive concept are described with reference to the accompanying drawings. As those skilled in the art would realize, the described embodiments may be modified in various ways without departing from the spirit or scope of the inventive concept. Embodiments may be practiced without some or all of these specified details. Well known process steps and/or structures may not be described in detail, in the interest of clarity.

The drawings and descriptions are illustrative and not restrictive. Like reference numerals may designate like (e.g., analogous or identical) elements in the specification. To the extent possible, any repetitive description will be minimized.

Relative sizes and thicknesses of elements shown in the drawings are chosen to facilitate description and understanding, without limiting the inventive concept. In the drawings, the thicknesses of some layers, films, panels, regions, etc., may be exaggerated for clarity.

Embodiments in the figures may represent idealized illustrations. Variations from the shapes illustrated may be possible, for example due to manufacturing techniques and/or tolerances. Thus, the example embodiments shall not be construed as limited to the shapes or regions illustrated herein but are to include deviations in the shapes. For example, an etched region illustrated as a rectangle may have rounded or curved features. The shapes and regions illustrated in the figures are illustrative and shall not limit the scope of the embodiments.

Although the terms "first," "second," etc. may be used herein to describe various elements, these elements shall not be limited by these terms. These terms may be used to distinguish one element from another element. Thus, a first element discussed below may be termed a second element without departing from the teachings of the present inventive concept. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

If a first element (such as a layer, film, region, or substrate) is referred to as being "on," "neighboring," "connected to," or "coupled with" a second element, then the first element can be directly on, directly neighboring, directly connected to or directly coupled with the second element, or an intervening element may also be present between the first element and the second element. If a first element is referred to as being "directly on," "directly neighboring," "directly connected to," or "directly coupled with" a second element, then no intended intervening element (except environmental elements such as air) may be present between the first element and the second element.

Spatially relative terms, such as "beneath," "below," "lower," "above," "upper," and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientation), and the spatially relative descriptors used herein shall be interpreted accordingly.

The terminology used herein is for the purpose of describing particular embodiments and is not intended to limit the inventive concept. As used herein, singular forms, "a," "an," and "the" may indicate plural forms as well, unless the context clearly indicates otherwise. The terms "includes" and/or "including," when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as what is commonly understood by one of ordinary skill in the art related to this field. Terms, such as those defined in commonly used dictionaries, shall be interpreted as having meanings that are consistent with their meanings in the context of the relevant art and shall not be interpreted in an idealized or overly formal sense unless expressly so defined herein.

The term "connect" may mean "electrically connect." The term "insulate" may mean "electrically insulate."

Unless explicitly described to the contrary, the word "comprise" and variations such as "comprises," "comprising," "include," or "including" may imply the inclusion of stated elements but not the exclusion of other elements.

Various embodiments, including methods and techniques, are described in this disclosure. Embodiments of the inventive concept may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the inventive concept may also cover apparatuses for practicing embodiments of the inventive concept. Such apparatus may include circuits, dedicated and/or programmable, to carry out operations pertaining to embodiments of the inventive concept. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the inventive concept.

This inventive concept is described below in reference to the accompanying drawings.

In one embodiment, a switched-capacitor circuit of this inventive concept may comprise a first capacitor branch, a second capacitor branch, and a transistor connecting the first capacitor branch and the second capacitor branch. Each of the first capacitor branch and the second capacitor branch has at least one high-resistance resistor, whose resistances are much higher than the on-resistance when the transistor is in an "ON" state and the parasitic resistance between a source and a drain of the transistor when the transistor is in an "OFF" state.

The switched-capacitor circuit in this embodiment has a simple structure and can effectively reduce the on-resistance when the circuit is in an "ON" mode and the parasitic resistance when the circuit is in an "OFF" mode. Details of this switched-capacitor circuit are described below.

Figure 3:
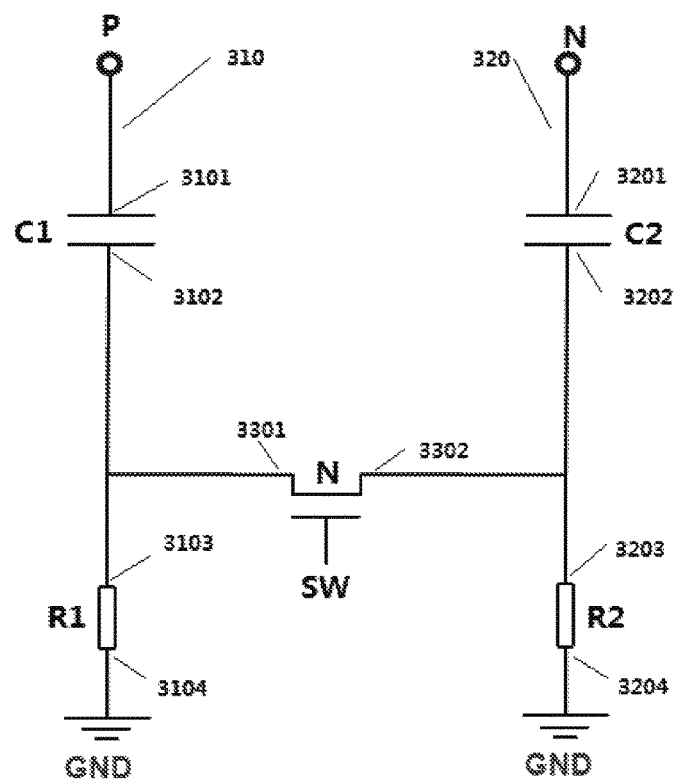
FIG. 3 shows a diagram illustrating a switched-capacitor circuit in accordance with one or more embodiments of this inventive concept.

FIG. 3 shows a diagram illustrating a switched-capacitor circuit in accordance with one or more embodiments of this inventive concept. The switched-capacitor circuit comprises a first capacitor branch 310, a second capacitor branch 320, and a transistor N. A first node 3301 of the transistor N is connected to a first node 3102 of a first capacitor C1 in the first capacitor branch 310 and a first node 3103 of a first high-resistance resistor R1 in the first capacitor branch 310, a second node 3104 of the first high-resistance resistor R1 in the first capacitor branch 310 is grounded. A second node 3302 of the transistor N is connected to a first node 3202 of a second capacitor C2 in the second capacitor branch 320 and a first node 3203 of a second high-resistance resistor R2 in the second capacitor branch 320, a second node 3204 of the second high-resistance resistor R2 in the second capacitor branch 320 is grounded.

A second node 3101 of the first capacitor C1 in the first capacitor branch 310 is connected to a positive node P of a differential signal, a second node 3201 of the second capacitor C2 in the second capacitor branch 320 is connected to a negative node N of the differential signal. The transistor N may be a MOS transistor, or more particularly an NMOS transistor, and a gate of the transistor N is connected to a control voltage SW.

The resistances of the first high-resistance resistor R1 and the second high-resistance resistor R2 are both much higher than either an on-resistance of the transistor N when the transistor N is in an "ON" state, and a parasitic resistance between a source and a drain of the transistor N when the transistor N is in an "OFF" state. The resistances of the first high-resistance resistor R1 and the second high-resistance resistor R2 may be higher than 1 k ohm and smaller than 1000 k ohm, and, in one embodiment, may be 50 k ohm.

The structure of a switched-capacitor circuit in accordance with one or more embodiments of this inventive concept is described herein. This circuit has a simple structure and can effectively reduce the on-resistance when the circuit is in an "ON" mode and the parasitic resistance when the circuit is in an "OFF" mode. Next, the operation mechanism of this circuit will be described assuming the transistor N is an NMOS transistor.

Figure 4:
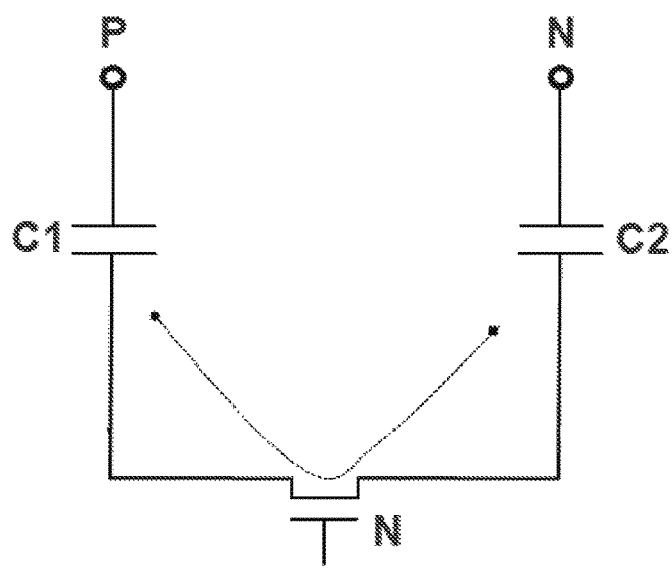
FIG. 4 shows a diagram illustrating a switched-capacitor circuit in an "ON" mode in accordance with one or more embodiments of this inventive concept.

Referring to FIG. 4, when the switched-capacitor circuit is in an "ON" mode, that is, when the control voltage SW connecting to an NMOS transistor N is a high voltage, since each of the first high-resistance resistor R1 and the second high-resistance resistor R2 has one node grounded, and the resistances of the first high-resistance resistor R1 and the second high-resistance resistor R2 are much higher than the on-resistance of the NMOS transistor N when the transistor N is in an "ON" state, the first high-resistance resistor R1 and the second high-resistance resistor R2 provide a DC bias for the source and the drain of the NMOS transistor N, and thus ensure that the NMOS transistor N is in the "ON" state and has an on-resistance of:

$$R_{on} = \frac{1}{\mu C_{ox}\left(\frac{W}{L}\right)(V_g - V_t)}$$

wherein μ is an electronic migration rate, Cox is a capacitance of a gate oxide layer, W and L are the width and length of the NMOS transistor N, respectively, $V_g$ is a gate voltage of the NMOS transistor N, and $V_t$ is an on-voltage of the NMOS transistor N.

On the other hand, the first high-resistance resistor R1 and the second high-resistance resistor R2 block the AC path to the ground (GND), and thus maintain a high resistance to the AC signal, therefore the first high-resistance resistor R1 and the second high-resistance resistor R2 do not attenuate the AC signal. Additionally, there exists an AC path between the positive node P and the negative node N formed by serially-connecting the first capacitor C1 and the second capacitor C2, and since the NMOS transistor N is in an "ON" state, its DC resistance is very small and can be ignored.

The Quality factor in the "ON" mode is:

$$Q = \frac{2\pi f\left(\frac{co}{2}\right)}{R_{on}},$$

wherein the capacitance of the first capacitor C1 is assumed to be the same as that of the second capacitor C2 and both equal to co. The Quality factor Q is a ratio of an imaginary part to a real part of a resistance between the positive node P and the negative node N. Since the first capacitor C1, the second capacitor C2, and the NMOS transistor N are serially connected between the positive node P and the negative node N, the resistance between the positive node P and the negative node N is a total resistance of the first capacitor C1, the second capacitor C2, and the on-resistance of the NMOS transistor N, and the imaginary part of the resistance between the positive node P and the negative node N is $$\frac{co}{2},$$

which is the total capacitance of the serially connected the first capacitor C1 and the second capacitor C2.

In this embodiment, when the control voltage SW of the NMOS transistor N is a high voltage, the first capacitor branch 310 and the second capacitor branch 320 are serially connected to form an AC path. In this case, the equivalent on-resistance is very small, which ensures a high Quality factor when the circuit is in an "ON" mode.

Figure 5:
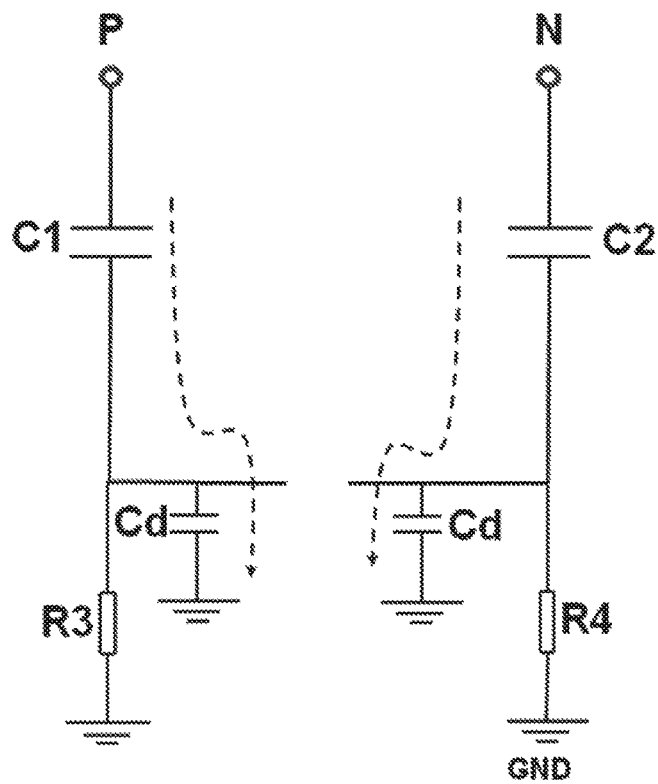
FIG. 5 shows a diagram illustrating a switched-capacitor circuit in an "OFF" mode in accordance with one or more embodiments of this inventive concept.

FIG. 5 shows a diagram illustrating a switched-capacitor circuit in an "OFF" mode in accordance with one or more embodiments of this inventive concept. When the control voltage SW of the NMOS transistor N is a low voltage, the NMOS transistor N remains in the "OFF" state. In this case, an equivalent capacitor between the positive node P and the negative node N approximately equals to the parasitic capacitor between the first capacitor C1 and the second capacitor C2, which is a parasitic capacitor Cd between the source and the drain of the NMOS transistor N.

Figure 2:
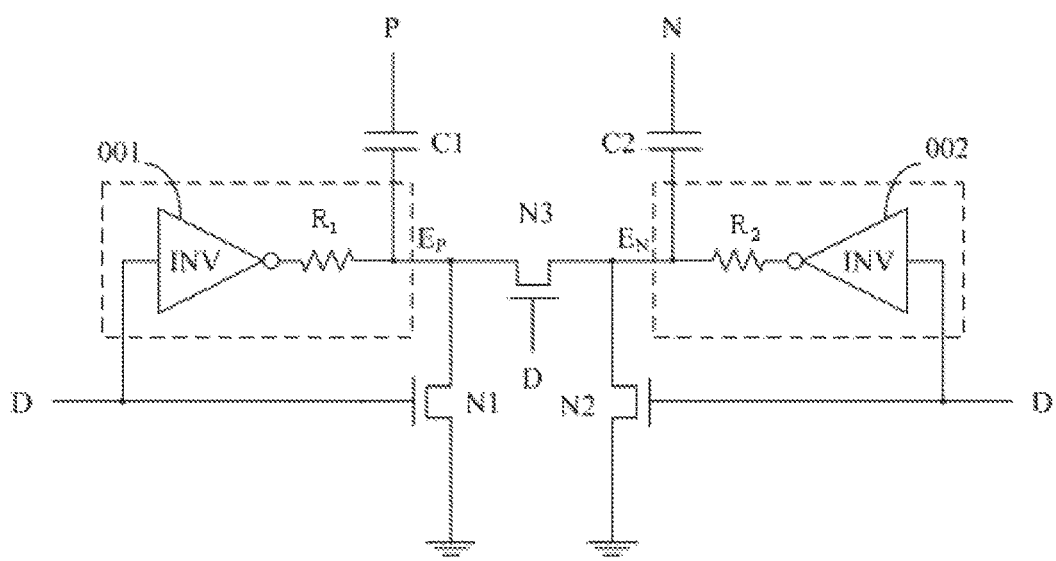
FIG. 2 shows a diagram illustrating another conventional switched-capacitor circuit.

Compared to the circuit of FIG. 2, the switched-capacitor circuit of this inventive concept eliminates the parasitic capacitor in two NMOS transistors, and thus reduces the overall parasitic capacitance when the circuit is in the "OFF" mode.

The inventive concept further presents a radio frequency device. The radio frequency device may comprise a switched-capacitor circuit of this inventive concept. The switched-capacitor circuit of this inventive concept effectively reduces the parasitic capacitance when the circuit is in the "OFF" mode, while maintaining a high Quality factor when the circuit is in the "ON" mode, therefore it improves the efficiency of the radio frequency device, which could be an operational amplifier, a voltage controlled oscillator, a low noise amplifier, or a frequency mixer.

Figure 6:
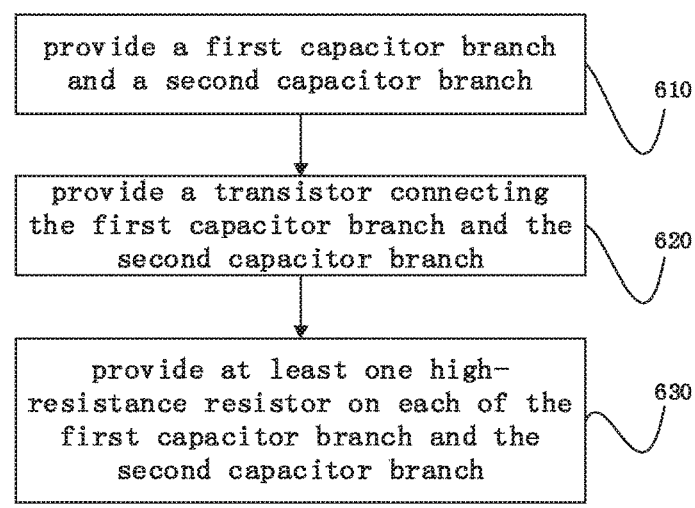
FIG. 6 shows a diagram illustrating a switched-capacitor circuit manufacturing method in accordance with one or more embodiments of this inventive concept.

FIG. 6 shows a diagram illustrating a switched-capacitor circuit manufacturing method in accordance with one or more embodiments of this inventive concept. The manufacturing method comprises:

in step 610, providing a first capacitor branch and a second capacitor branch;

in step 620. providing a transistor connecting the first capacitor branch and the second capacitor branch. The transistor may be a MOS transistor, or more particularly an NMOS transistor.

In step 630, providing at least one high-resistance resistor on each of the first capacitor branch and the second capacitor branch. The resistances of these high-resistance resistors are much higher than either the on-resistance of the transistor when the transistor is in an "ON" state, or the parasitic resistance between a source and a drain of the transistor when the transistor is in an "OFF" state.

The switched-capacitor circuit formed in this method can effectively reduce the parasitic capacitance when the circuit is in an "OFF" mode, while maintaining a high Quality factor when the circuit is in an "ON" mode.

In one embodiment of this inventive concept, a first node of the transistor may be connected to a first node of a first capacitor C1 in the first capacitor branch and a first node of a first high-resistance resistor R1 in the first capacitor branch, a second node of the first high-resistance resistor R1 in the first capacitor branch is grounded. A second node of the transistor may be connected to a first node of the second capacitor C2 in the second capacitor branch and a first node of the second high-resistance resistor R2 in the second capacitor branch, the second node of the second high-resistance resistor R2 in the second capacitor branch is grounded. A gate of the transistor is connected to a control voltage, a second node of the first capacitor C1 in the first capacitor branch is connected to a positive node of a differential signal, and a second node of the second capacitor C2 in the second capacitor branch is connected to a negative node of the differential signal.

In this embodiment, when the control voltage of the transistor is a high voltage, the first capacitor branch and the second capacitor branch are serially connected to form an AC path, when the control voltage of the transistor is a low voltage, an equivalent capacitance for the first capacitor branch and an equivalent capacitance for the second capacitor branch are a parasitic capacitance on a source of the transistor and a parasitic capacitance on a drain of the transistor, respectively. Therefore, this switched-capacitor circuit effectively reduces the parasitic capacitance when the circuit is in an "OFF" mode, while maintaining a high Quality factor when the circuit is in an "ON" mode.

This concludes the description of a semiconductor device and its operation method in accordance with one or more embodiments of this inventive concept. For purposes of conciseness and convenience, some components or procedures that are well known to one of ordinary skills in the art in this field are omitted. These omissions, however, do not prevent one of ordinary skill in the art in this field to make and use the inventive concept herein disclosed.

While this inventive concept has been described in terms of several embodiments, there are alterations, permutations, and equivalents, which fall within the scope of this disclosure. It shall also be noted that there are alternative ways of implementing the methods and/or apparatuses of the inventive concept. Furthermore, embodiments may find utility in other applications. It is therefore intended that the claims be interpreted as including all such alterations, permutations, and equivalents. The abstract section is provided herein for convenience and, due to word count limitation, is accordingly written for reading convenience and shall not be employed to limit the scope of the claims.

What is claimed is:

1. A switched-capacitor circuit, comprising:
   a first capacitor branch and a second capacitor branch, wherein each of the first capacitor branch and the second capacitor branch has at least one high-resistance resistor; and
   a transistor connecting the first capacitor branch and the second capacitor branch, wherein a first node of the transistor is connected to a first node of a first capacitor in the first capacitor branch and a first node of a first high-resistance resistor in the first capacitor branch, a second node of the first high-resistance resistor in the first capacitor branch is grounded,
   and wherein a second node of the transistor is connected to a first node of a second capacitor in the second capacitor branch and a first node of a second high-resistance resistor in the second capacitor branch, a second node of the second high-resistance resistor in the second capacitor branch is grounded.

2. The circuit of claim 1, wherein the transistor is a Metal Oxide Semiconductor (MOS) transistor.

3. The circuit of claim 2, the MOS transistor is a N-type Metal Oxide Semiconductor (NMOS) transistor.

4. The circuit of claim 1, wherein a gate of the transistor is connected to a control voltage, a second node of the first capacitor in the first capacitor branch is connected to a positive node of a differential signal, and a second node of the second capacitor in the second capacitor branch is connected to a negative node of the differential signal.

5. A switched-capacitor circuit, comprising:
   a first capacitor branch and a second capacitor branch, wherein each of the first capacitor branch and the second capacitor branch has at least one high-resistance resistor; and
   a transistor connecting the first capacitor branch and the second capacitor branch, wherein the resistances of the high-resistance resistors are higher than either an on-resistance of the transistor when the transistor is in an "ON" state, or a parasitic resistance between a source and a drain of the transistor when the transistor is in an "OFF" state.

6. The circuit of claim 5, wherein the resistances of the high-resistance resistors are higher than 1 k ohm and lower than 1000 k ohm.

7. The circuit of claim 6, wherein the resistances of the high-resistance resistors are 50 k ohm.

8. The circuit of claim 1, wherein when a control voltage of the transistor is a high voltage, the first capacitor branch and the second capacitor branch are serially connected to form an AC path, when the control voltage of the transistor is a low voltage, an equivalent capacitance of the first capacitor branch equals to a parasitic capacitance on a source of the transistor, and an equivalent capacitance of the second capacitor branch equals to a parasitic capacitance on a drain of the transistor.

9. The circuit of claim 5, wherein when a control voltage of the transistor is a high voltage, the first capacitor branch and the second capacitor branch are serially connected to form an AC path, when the control voltage of the transistor is a low voltage, an equivalent capacitance of the first capacitor branch equals to a parasitic capacitance on a source of the transistor, and an equivalent capacitance of the second capacitor branch equals to a parasitic capacitance on a drain of the transistor.

10. A switched-capacitor circuit manufacturing method, comprising:
    providing a first capacitor branch and a second capacitor branch;
    providing a transistor connecting the first capacitor branch and the second capacitor branch; and
    providing at least one high-resistance resistor at each of the first capacitor branch and the second capacitor branch, wherein the resistances of the high-resistance resistors are higher than either an on-resistance of the transistor when the transistor is in an "ON" state, or a parasitic resistance between a source and a drain of the transistor when the transistor is in an "OFF" state.

11. The method of claim 10, wherein a first node of the transistor is connected to a first node of a first capacitor in the first capacitor branch and a first node of a first high-resistance resistor in the first capacitor branch, a second node of the first high-resistance resistor in the first capacitor branch is grounded,
    and wherein a second node of the transistor is connected to a first node of a second capacitor in the second capacitor branch and a first node of a second high-resistance resistor in the second capacitor branch, a second node of the second high-resistance resistor in the second capacitor branch is grounded.

12. The method of claim 11, wherein a gate of the transistor is connected to a control voltage, a second node of the first capacitor in the first capacitor branch is connected to a positive node of a differential signal, a second node of the second capacitor in the second capacitor branch is connected to a negative node of the differential signal.

13. The method of claim 10, wherein when a control voltage of the transistor is a high voltage, the first capacitor branch and the second capacitor branch are serially connected to form an AC path, when the control voltage of the transistor is a low voltage, an equivalent capacitance of the first capacitor branch equals to a parasitic capacitance on a source of the transistor, and an equivalent capacitance of the second capacitor branch equals to a parasitic capacitance on a drain of the transistor.

* * * * *